(12) United States Patent
Du (10) Patent No.: US 10,505,141 B2
(45) Date of Patent: Dec. 10, 2019

(54) FLEXIBLE DISPLAY SUBSTRATE, MANUFACTURING METHOD THEREOF, AND FLEXIBLE DISPLAY DEVICE

(71) Applicant: BOE TECHNOLOGY GROUP CO., LTD., Beijing (CN)

(72) Inventor: Xiaobo Du, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/543,750

(22) PCT Filed: Jan. 11, 2017

(86) PCT No.: PCT/CN2017/070849
§ 371 (c)(1),
(2) Date: Jul. 14, 2017

(87) PCT Pub. No.: WO2017/185831
PCT Pub. Date: Nov. 2, 2017

(65) Prior Publication Data
US 2019/0074474 A1     Mar. 7, 2019

(30) Foreign Application Priority Data
Apr. 29, 2016 (CN) .......................... 2016 1 0284422

(51) Int. Cl.
*H01L 51/52* (2006.01)
*G02F 1/1333* (2006.01)
*H01L 51/00* (2006.01)

(52) U.S. Cl.
CPC .... *H01L 51/5225* (2013.01); *G02F 1/133305* (2013.01); *H01L 51/0097* (2013.01); *G02F 1/1333* (2013.01); *H01L 2251/5338* (2013.01)

(58) Field of Classification Search
CPC .................................................... H01L 51/5225
See application file for complete search history.

(56) References Cited

U.S. PATENT DOCUMENTS

| 6,174,613 | B1 | 1/2001 | Antoniadis et al. |
| 9,024,336 | B2 | 5/2015 | Yeh |
| 2008/0042940 | A1* | 2/2008 | Hasegawa ............... G02F 1/167 345/76 |
| 2012/0280229 | A1 | 11/2012 | Suzuki et al. |
| 2013/0119352 | A1 | 5/2013 | Aurongzeb |

(Continued)

FOREIGN PATENT DOCUMENTS

| CN | 102044558 A | 5/2011 |
| CN | 102598231 A | 7/2012 |

(Continued)

OTHER PUBLICATIONS

First Office Action for Chinese Application No. 201610284422.5, dated Nov. 22, 2016, 6 Pages.

(Continued)

*Primary Examiner* — Raj R Gupta
(74) *Attorney, Agent, or Firm* — Brooks Kushman P.C.

(57) ABSTRACT

A flexible display substrate, a manufacturing method thereof and a flexible display device are provided. The flexible display substrate includes a flexible substrate and a cathode layer arranged on the flexible substrate and provided with at least one gap.

18 Claims, 6 Drawing Sheets

(56) References Cited

U.S. PATENT DOCUMENTS

| | | | |
|---|---|---|---|
| 2014/0001950 A1* | 1/2014 | Fujii | G02B 1/04 |
| | | | 313/504 |
| 2014/0118415 A1 | 5/2014 | Seo | |
| 2015/0249120 A1 | 9/2015 | Cheng et al. | |
| 2016/0079313 A1 | 3/2016 | Ma et al. | |
| 2016/0260923 A1* | 9/2016 | Wu | H01L 27/326 |
| 2016/0372652 A1 | 12/2016 | Shi et al. | |
| 2017/0045775 A1 | 2/2017 | Zhong et al. | |

FOREIGN PATENT DOCUMENTS

| | | |
|---|---|---|
| CN | 103456764 A | 12/2013 |
| CN | 104134681 A | 11/2014 |
| CN | 104536187 A | 4/2015 |
| CN | 104538423 A | 4/2015 |
| CN | 104765188 A | 7/2015 |
| CN | 105789262 A | 7/2016 |

OTHER PUBLICATIONS

Second Office Action for Chinese Application No. 201610284422.5, dated Mar. 2, 2017, 8 Pages.
Third Office Action for Chinese Application No. 201610284422.5, dated May 31, 2017, 8 Pages.
Fourth Office Action for Chinese Application No. 201610284422.5, dated Aug. 22, 2017, 6 Pages.
International Search Report and Written Opinion for Application No. PCT/CN2017/070849, dated Apr. 14, 2017, 10 Pages.
Extended European Search Report for European Application No. 17734970 dated Sep. 7, 2018, 9 Pages.

* cited by examiner

FLEXIBLE DISPLAY SUBSTRATE, MANUFACTURING METHOD THEREOF, AND FLEXIBLE DISPLAY DEVICE

CROSS-REFERENCE TO RELATED APPLICATIONS

This application is the U.S. national phase of PCT Application No. PCT/CN2017/070849 filed on Jan. 11, 2017, which claims priority to Chinese Patent Application No. 201610284422.5 filed Apr. 29, 2016, the disclosures of which are incorporated in their entirety by reference herein.

TECHNICAL FIELD

The present disclosure relates to the field of display technology, in particular to a flexible display substrate, a manufacturing method thereof, and a flexible display device.

BACKGROUND

Along with the development of the display technology, a flexible display device with a display mode close to a conventional display mode will come into people's view very quickly. Due to such feature as being bendable, it is able for the flexible display device to provide special user experience.

Currently, the flexible display device, e.g., a flexible display Organic Light-Emitting Diode (OLED) device, still adopts a structure similar to a conventional rigid display device, i.e., a cathode layer on a flexible substrate is formed by an entire layer made of a metal, such as aluminium, silver or magnesium.

However, as compared with the rigid display device in the related art, the flexible display device needs to be bent repeatedly, so as to meet different usage requirements. In addition, a binding force between the cathode layer and an organic material layer is very small. After being bent repeatedly, the cathode layer may be easily broken and meanwhile separated from the organic material layer, so a service life of the flexible display device may be seriously adversely affected.

SUMMARY

An object of the present disclosure is to provide a flexible display substrate, a manufacturing method thereof, and a flexible display device, so as to prevent the cathode layer from being broken after the flexible display device has been bent repeatedly.

In one aspect, the present disclosure provides in at least one embodiment a flexible display substrate, including a flexible substrate and a cathode layer arranged on the flexible substrate. The cathode layer is provided with at least one gap.

Optionally, the at least one gap extends in a direction identical to a bendable direction of the flexible display substrate.

Optionally, the flexible display substrate further includes a curved portion and a non-curved portion, and the at least one gap is arranged in the cathode layer at the curved portion.

Optionally, the cathode layer at the non-curved portion is an unbroken layer without the gap.

Optionally, the cathode layer includes at least two cathode units separated from each other, and each gap is arranged between the cathode units.

Optionally, the flexible display substrate further includes a plurality of subpixels, and the gap between the cathode units is located at a position corresponding to, and has a width smaller than or equal to, the gap between the subpixels.

Optionally, the cathode units are arranged in a column, and each cathode unit corresponds to the subpixels in at least one column.

Optionally, the cathode units are arranged in a row, and each cathode unit corresponds to the subpixels in at least one row.

Optionally, each cathode unit is strip-like.

Optionally, ends of at least two of the cathode units are connected to each other.

In another aspect, the present disclosure provides in at least one embodiment a method for manufacturing a flexible display substrate, including: forming a cathode layer provided with at least one gap.

Optionally, the cathode layer is formed through an evaporation or patterning process.

In yet another aspect, the present disclosure provides in at least one embodiment a flexible display device including the above-mentioned flexible display substrate.

In still yet another aspect, the present disclosure provides in at least one embodiment a flexible display substrate, including: a first organic material layer; a cathode layer provided with at least one gap; and a second organic material layer. The cathode layer is sandwiched between the first organic material layer and the second organic material layer, and the first organic material layer is in direct contact with the second organic material layer through the at least one gap.

Optionally, the at least one gap is strip-like.

Optionally, the cathode layer is provided with a plurality of strip-like gaps separated from each other, and the first organic material layer is in direct contact with the second organic material layer through the gaps.

Optionally, the flexible display substrate further includes a plurality of subpixels, and a vertical distance between two opposite subpixels arranged at both sides of each strip-like gap along a width direction of the strip-like gap is greater than or equal to a width of the strip-like gap.

According to at least one embodiment of the present disclosure, the flexible display substrate includes the flexible substrate, and the cathode layer provided with at least one gap is arranged on the flexible substrate. Due to the at least one gap, it is able to reduce a stress generated in the case that the cathode layer is bent and deformed. In addition, in actual application, usually the organic material layers are arranged on and under the cathode layer. As compared with a binding force between the cathode layer and the organic material layer, a larger binding force may exist between the organic material layers. In the case that the cathode layer is provided with at least one gap, it is able to increase a contact area between the organic material layers and increase the binding force, thereby to prevent the cathode layer from being separated from the organic material layers easily, prevent the cathode layer from being broken or removed off from the organic material layer after the cathode layer has been bent repeatedly, and prolong a service life of the flexible display substrate.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In order to solve the problem in the related art where a cathode layer is easily broken after a flexible display device has been repeatedly bent, the present disclosure provides in at least one embodiment a flexible display substrate, including a flexible substrate and a cathode layer arranged on the flexible substrate. The cathode layer is provided with at least one gap.

According to at least one embodiment of the present disclosure, due to the at least one gap in the cathode layer, it is able to reduce a stress generated in the case that the cathode layer is bent and deformed. In addition, in actual application, usually the organic material layers are arranged on and under the cathode layer. As compared with a binding force between the cathode layer and the organic material layer, a larger binding force may exist between the organic material layers. In the case that the cathode layer is provided with at least one gap, it is able to increase a contact area between the organic material layers and increase the binding force, thereby to prevent the cathode layer from being separated from the organic material layers easily, prevent the cathode layer from being broken or removed off from the organic material layer after the cathode layer has been bent repeatedly, and prolong a service life of the flexible display substrate.

For example, in the flexible display substrate, the cathode layer may be arranged on an organic material light-emitting layer. After the flexible display substrate has been packaged, an organic material packaging layer may be arranged on the cathode layer, i.e., the cathode layer may be arranged between the organic material light-emitting layer and the organic material packaging layer. In the case that the cathode layer is an unbroken layer, the organic material light-emitting layer may not be in direct contact with the organic material packaging layer. In the case that the cathode layer is provided with at least one gap, the organic material light-emitting layer may be in partially, directly contact with the organic material packaging layer. As compared with a binding force between the cathode layer and the organic material light-emitting layer or the organic material packaging layer, a larger binding force may exist between the organic material light-emitting layer and the organic material packaging layer, so it is able to prevent the cathode layer from being separated from the organic material light-emitting layer or organic material packaging layer easily, thereby to prevent the cathode layer from being damaged.

In at least one embodiment of the present disclosure, the gap in the cathode layer may extend in a direction identical to a bendable direction of the flexible display substrate, so as to further reduce the stress generated by the cathode layer in the case that it is bent and deformed.

Optionally, in the case that the flexible display substrate includes a curved portion and a non-curved portion, the cathode layer at the curved portion may be provided with at least one gap, while the cathode layer at the non-curved portion may be an unbroken layer in which no gap is provided. In this way, the gap is merely provided in the cathode layer at the curved portion, so it is able to prevent the cathode layer from being broken or separated from the organic material layer after it has been bent repeatedly, and simply a manufacture process.

Optionally, the cathode layer includes at least two cathode units separated from each other, and each gap is arranged between the adjacent cathode units.

Optionally, the flexible display substrate further includes a plurality of subpixels, and the gap between the adjacent cathode units is located at a position s-corresponding to, and has a width smaller than or equal to, a gap between the adjacent subpixels.

Optionally, the cathode units are arranged in a column and each cathode unit corresponds to the subpixels in at least one column, or the cathode units are arranged in a row and each cathode unit corresponds to the subpixels in at least one row.

Optionally, each cathode unit is strip-like.

Optionally, ends of at least two of the cathode units are connected to each other.

The flexible display substrate will be described hereinafter in more details in conjunction with the drawings.

Figure 1:
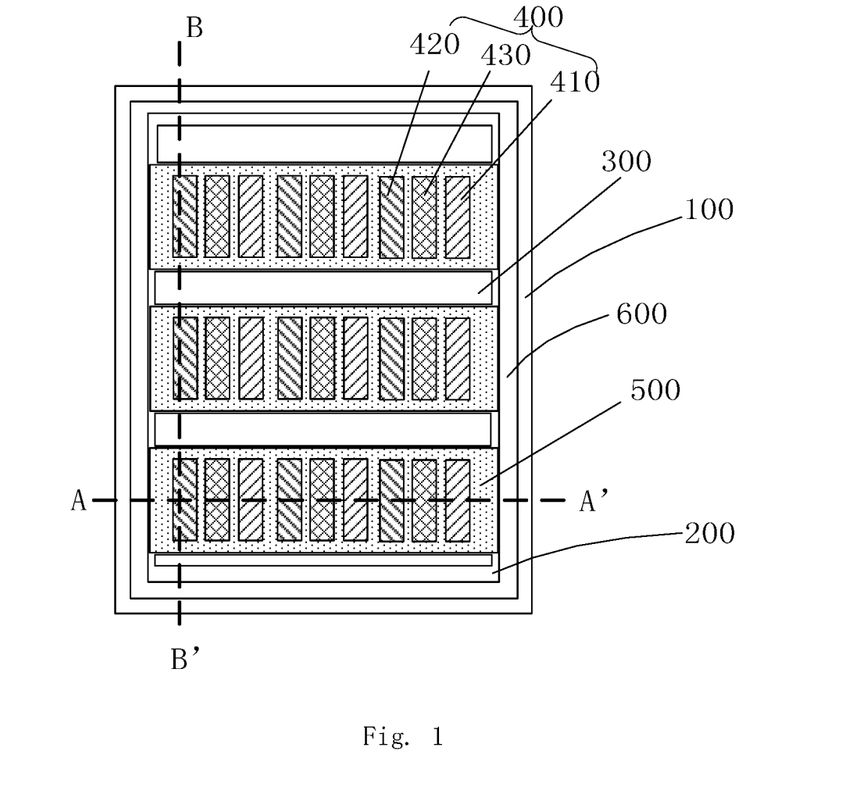
FIG. 1 is a sectional view of a flexible display substrate in at least one embodiment of the present disclosure.
Figure 2:
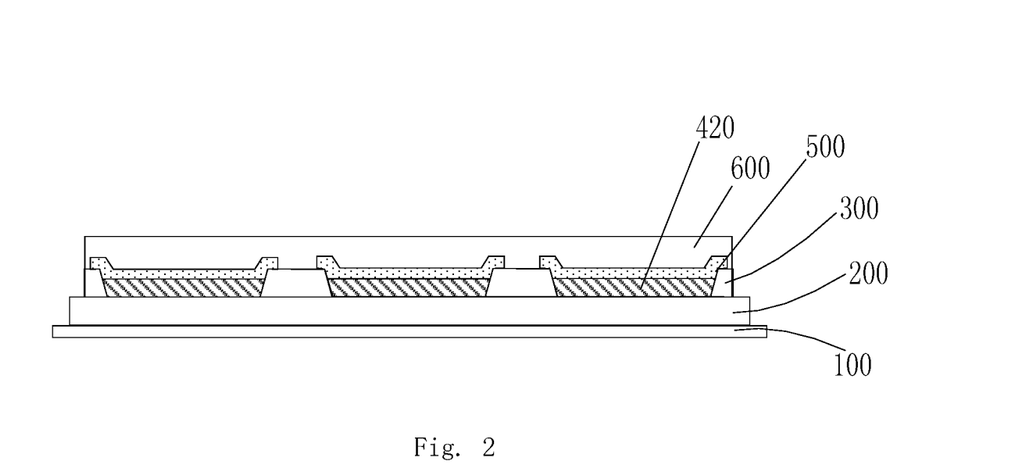
FIG. 2 is a sectional view of the flexible display substrate in FIG. 1 along line BB'.
Figure 3:
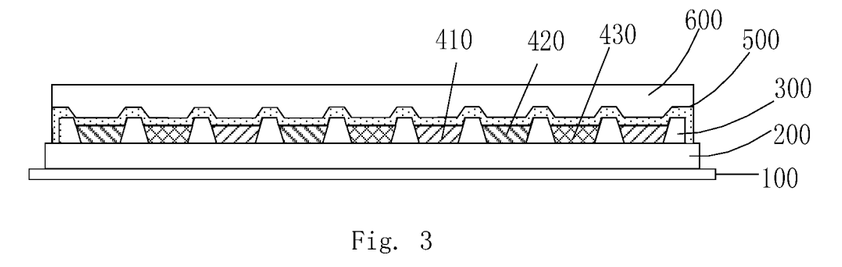
FIG. 3 is another sectional view of the flexible display substrate in FIG. 1 along line AA'.

FIG. 1 is a sectional view of the flexible display substrate, FIG. 2 is a sectional view of the flexible display substrate along line BB' in FIG. 1, and FIG. 3 is a sectional view of the flexible display substrate along line AA', where a direction in which line AA' extends may be called as a row direction, and a direction in which line BB' extends may be called as a column direction.

To be specific, the flexible display substrate in at least one embodiment of the present disclosure includes a base substrate 100 (e.g., a flexible substrate), a thin film transistor array 200, a pixel definition layer 300, an organic material light-emitting layer 400, a cathode layer 500 and a light extraction layer 600 (an organic material layer). It should be appreciated that, depending on the structure of the flexible display substrate, the light extraction layer may be optional, and in the case that no light extraction layer is included, usually an organic material packaging layer may be arranged on the cathode layer 500 after the packaging.

Depending on light colors, the organic material light-emitting layer 400 may be divided into a plurality of subpixels, e.g., red subpixels 410, green subpixels 420 or blue subpixels 430.

Figure 4:
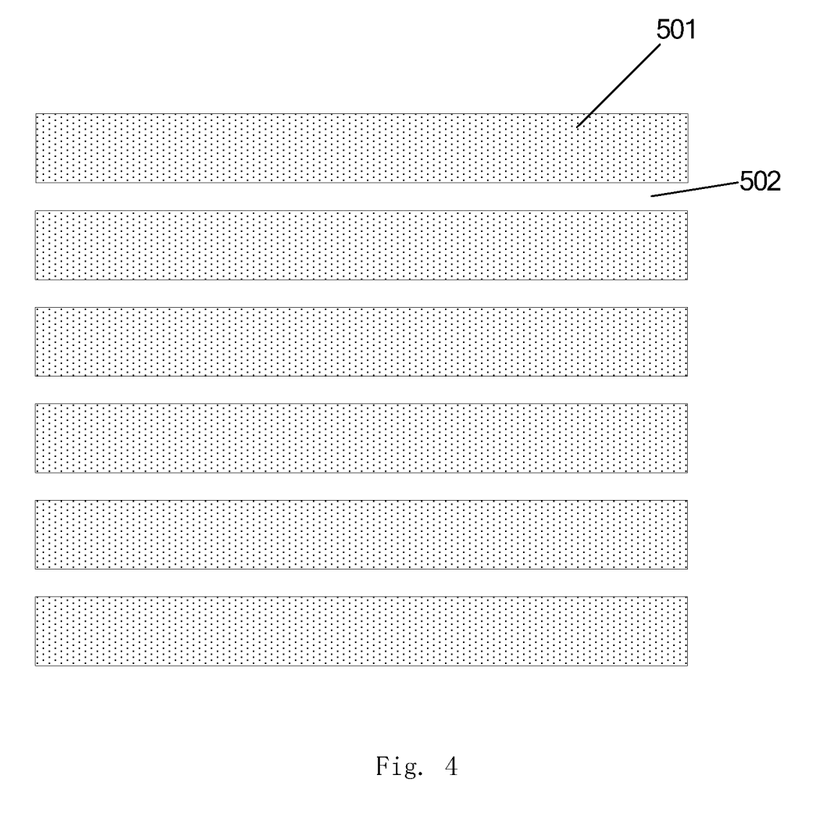
FIG. 4 is a schematic view showing a cathode layer of the flexible display substrate in at least one embodiment of the present disclosure.

Referring to FIG. 4, which is a schematic view showing the cathode layer of the flexible display substrate, the cathode layer 500 includes a plurality of cathode units 501 separated from each other, and a gap 502 is arranged between the adjacent cathode units 501.

To be specific, each cathode unit 501 is, but not limited to, strip-like, i.e., it may be of any other shapes according to the practical need.

Referring to FIG. 1, the red subpixels 410, the green subpixels 420 and the blue subpixels 430 are arranged alternately in the row direction of the flexible display substrate, and the subpixels in each column are separated from each other. As shown in FIGS. 2 and 3, the cathode units 501 are separated from each other in the column direction, and each of the cathode units 501 corresponds to the subpixels in one row. Each cathode unit 501 has a width in the column direction greater than the subpixels in the corresponding row in the column direction, so that the cathode unit 501 may completely cover the corresponding subpixels to ensure the normal electron injection.

In other words, in the flexible display substrate in at least one embodiment of the present disclosure, in order to ensure the normal electron injection, the gap between the adjacent cathode units needs to correspond to a gap between the adjacent subpixels, and a width of the gap between the adjacent cathode units needs to be smaller than or equal to a width of the gap between the adjacent subpixels.

In at least one embodiment of the present disclosure, the cathode units may be arranged in a row, and each cathode unit may correspond to the subpixels in at least one row.

Figure 5:
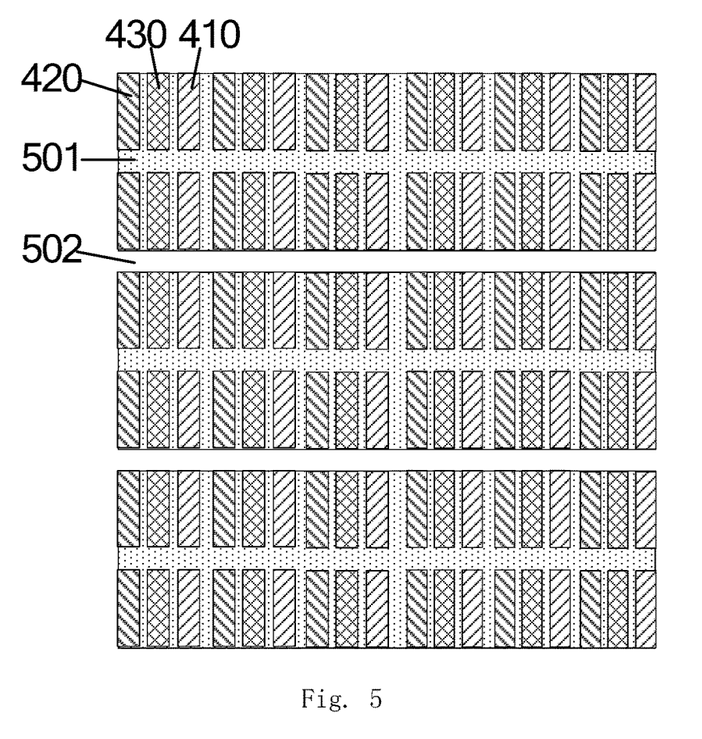
FIG. 5 is a schematic view showing the cathode layer and an organic material light-emitting layer of the flexible display substrate in at least one embodiment of the present disclosure.

For example, as shown in FIG. 2, the cathode units 501 are arranged in a row, and each cathode unit 501 corresponds to the subpixels in one row. Optionally, as shown in FIG. 5, the cathode units 501 are arranged in rows, and each cathode unit 501 corresponds to the subpixels in two rows, i.e., the width of each cathode unit 501 in the column direction is equal to a width of the corresponding subpixels in two rows in the column direction.

Of course, in at least one embodiment of the present disclosure, each cathode unit 501 may also correspond to the subpixels in three, four or more rows.

As compared with the situation where each cathode unit corresponds to the subpixels in one row, in the case that each cathode unit corresponds to the subpixels in more than one rows, it is able to enlarge an evaporation region of the cathode layer, reduce the difficulty in the manufacture of a mask plate, and simplify a manufacture process.

In at least one embodiment of the present disclosure, the cathode units may also be arranged in a column, and each cathode unit may correspond to the subpixels in at least one column.

Figure 6:
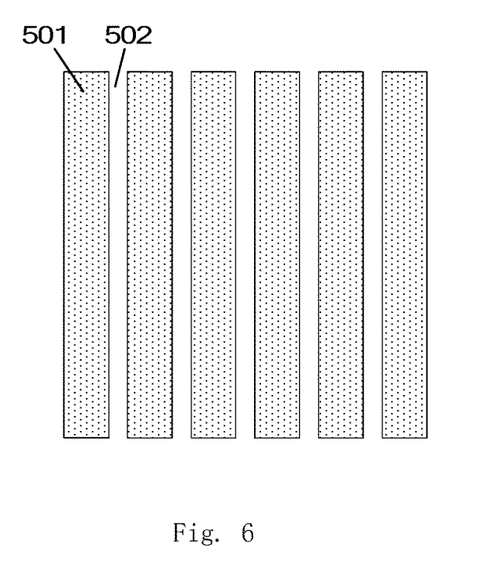
FIG. 6 is a schematic view showing the cathode layer of the flexible display substrate in at least one embodiment of the present disclosure.
Figure 7:
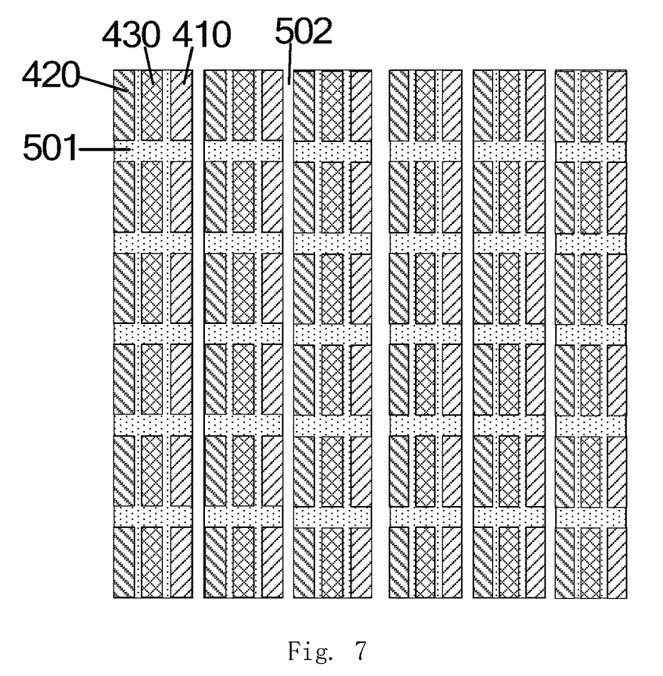
FIG. 7 is a schematic view showing the cathode layer and the organic material light-emitting layer of the flexible display substrate in at least one embodiment of the present disclosure.

For example, as shown in FIGS. 6 and 7, the cathode units 501 are arranged in a column, and each cathode unit 501 corresponds to the subpixels in one row. To be specific, as shown in FIG. 7, each cathode unit 501 corresponds to the subpixels in three columns, i.e., the width of each cathode unit 501 in the row direction is equal to a width of the subpixels in three columns in the row direction.

It should be noted that, in at least one embodiment of the present disclosure, each cathode unit 501 may correspond to the subpixels in four, five or more columns.

As compared with the situation where each cathode unit corresponds to the subpixels in one column, in the case that each cathode unit corresponds to the subpixels in more than one rows, it is able to enlarge an evaporation region of the cathode layer, reduce the difficulty in the manufacture of a mask plate, and simplify a manufacture process.

Generally, the gap between the subpixels in the column direction is larger than the gap between the subpixels in the row direction. Optionally, in order to reduce an error during the manufacture of the cathode layer, the cathode units may be arranged in a row, and each cathode unit may correspond to the subpixels in at least one row.

Figure 8:
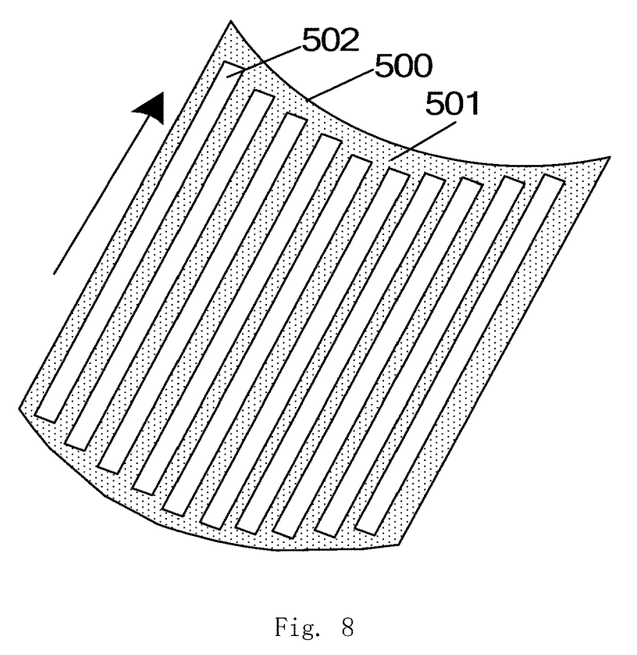
FIG. 8 is a schematic view showing a relationship between a gap in the cathode layer and a bendable direction of the flexible display substrate in at least one embodiment of the present disclosure.

As shown in FIG. 8, in at least one embodiment of the present disclosure, the gap 502 in the cathode layer 500 extends in a direction identical to a bendable direction of the flexible display substrate. The extension direction of the gap 502 is indicated by an arrow in FIG. 8, i.e., a length-based extension direction. The bendable direction of the flexible display substrate is also indicated by the arrow in FIG. 8, i.e., a length direction of a folding line of the flexible display substrate in the case that it is in a bending state.

In this way, it is able to remarkably reduce the stress generated by the cathode layer in the case that it is bent and deformed. In the case of manufacturing the cathode layer of the flexible display substrate, the extension direction of the gap in the cathode layer may also be determined in accordance with the bendable direction of the flexible display substrate.

Figure 9:
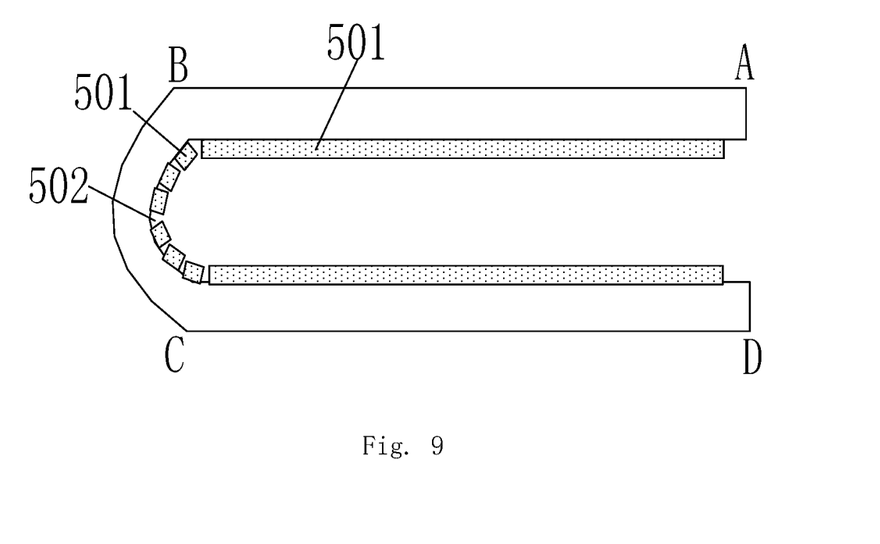
FIG. 9 is a view showing the cathode layer of the flexible display substrate in at least one embodiment of the present disclosure.

As shown in FIG. 9 which is a schematic view showing the cathode layer of the flexible display substrate, the cathode layer 500 includes a curved portion BC and non-curved portions AB, CD. The plurality of gaps 502 is arranged in the curved portion BC of the cathode layer 500, and the non-curved portions AB and CD of the cathode layer 500 are each an unbroken layer without any gap. In this way, the gaps are merely arranged in the curved portion of the cathode layer, so it is able to prevent the cathode layer from being broken or removed after it has been bent repeatedly, and simplify the manufacture process.

Figure 10:
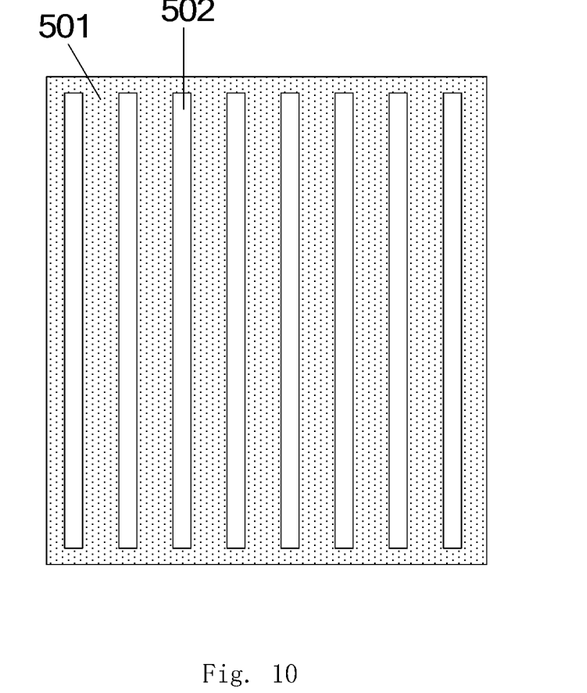
FIG. 10 is a schematic view showing a connection mode of cathode units of the flexible display substrate in at least one embodiment of the present disclosure.

In at least one embodiment of the present disclosure, in order not to connect each cathode unit to a driver circuit, ends of at least two cathode units of the cathode layer may be connected to each other, and then the cathode units may be connected to the driver circuit. For example, as shown in FIG. 10, the ends of all the cathode units are connected to each other.

The present disclosure further provides in at least one embodiment a flexible display device including the above-mentioned flexible display substrate.

Figure 11:
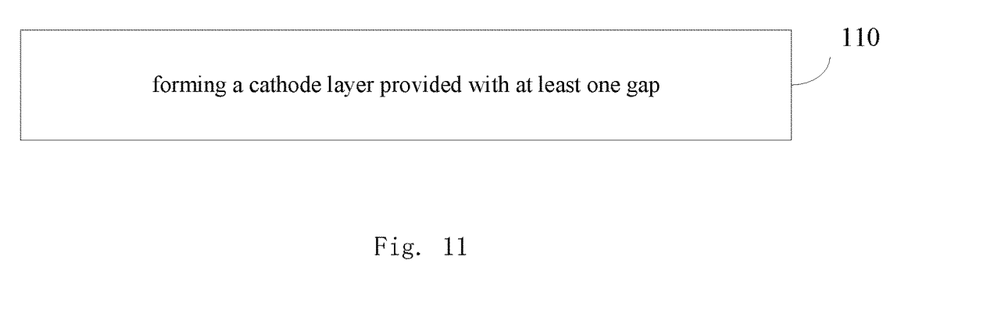
FIG. 11 is a flow chart of a method for manufacturing the flexible display substrate in at least one embodiment of the present disclosure.

As shown in FIG. 11, the present disclosure further provides in at least one embodiment a method for manufacturing a flexible display substrate includes Step 110 of forming a cathode layer provided with at least one gap. To be specific, the cathode layer may be formed through an evaporation or patterning process.

For example, the cathode layer may be formed as follows. A cathode membrane material may be placed in an evaporation source within a vacuum chamber, and a mask plate may be arranged at a side of the flexible substrate adjacent to the evaporation source. Next, the cathode membrane material may be evaporated by the evaporation source toward a surface of the flexible substrate so as to form the cathode layer. Through the mask plate, it is able to form the cathode layer provided with at least one gap.

The above are merely the preferred embodiments of the present disclosure. Obviously, a person skilled in the art may make further modifications and improvements without departing from the principle of the present disclosure, and these modifications and improvements shall also fall within the scope of the present disclosure.

What is claimed is:

1. A flexible display substrate, comprising a flexible substrate and a cathode layer arranged on the flexible substrate, wherein the cathode layer is provided with at least one gap;
   wherein the flexible display substrate further comprises a curved portion and a non-curved portion, wherein the at least one gap is arranged in the cathode layer at the curved portion; and
   the cathode layer at the non-curved portion is an unbroken layer without the gap.

2. The flexible display substrate according to claim 1, wherein the at least one gap extends in a direction identical to a bendable direction of the flexible display substrate.

3. The flexible display substrate according to claim 1, wherein the cathode layer comprises at least two cathode units separated from each other, and each gap is arranged between the cathode units.

4. The flexible display substrate according to claim 3, further comprising a plurality of subpixels, wherein the gap between the cathode units is located at a position corresponding to, and has a width smaller than or equal to, the gap between the subpixels.

5. The flexible display substrate according to claim 4, wherein ends of at least two of the cathode units are connected to each other.

6. The flexible display substrate according to claim 4, wherein the cathode units are arranged in a column, and each cathode unit corresponds to the subpixels in at least one column.

7. The flexible display substrate according to claim 6, wherein ends of at least two of the cathode units are connected to each other.

8. The flexible display substrate according to claim 4, wherein the cathode units are arranged in a row, and each cathode unit corresponds to the subpixels in at least one row.

9. The flexible display substrate according to claim 8, wherein ends of at least two of the cathode units are connected to each other.

10. The flexible display substrate according to claim 3, wherein each cathode unit is strip-like.

11. The flexible display substrate according to claim 3, wherein ends of at least two of the cathode units are connected to each other.

12. A method for manufacturing a flexible display substrate, comprising forming a cathode layer provided with at least one gap;
    wherein manufacturing the flexible display substrate further comprises providing a curved portion and a non-curved portion, wherein the at least one gap is arranged in the cathode layer at the curved portion;
    the cathode layer at the non-curved portion is an unbroken layer without the gap.

13. The method according to claim 12, wherein the cathode layer provided with at least one gap is formed through an evaporation or patterning process.

14. A flexible display device comprising the flexible display substrate according to claim 1.

15. A flexible display substrate, comprising:
    a first organic material layer;
    a cathode layer provided with at least one gap; and
    a second organic material layer,
    wherein the cathode layer is sandwiched between the first organic material layer and the second organic material layer;
    wherein the flexible display substrate further comprises a curved portion and a non-curved portion, wherein the at least one gap is arranged in the cathode layer at the curved portion;
    the cathode layer at the non-curved portion is an unbroken layer without the gap.

16. The flexible display substrate according to claim 15, wherein the at least one gap is strip-like.

17. The flexible display substrate according to claim 15, wherein the cathode layer is provided with a plurality of strip-like gaps separated from each other.

18. The flexible display substrate according to claim 17, further comprising a plurality of subpixels, wherein a vertical distance between two opposite subpixels arranged at both sides of each strip-like gap along a width direction of the strip-like gap is greater than or equal to a width of the strip-like gap.

* * * * *